(12) United States Patent
Jo et al.

(10) Patent No.: US 6,881,679 B2
(45) Date of Patent: Apr. 19, 2005

(54) ETCHING SOLUTION FOR ETCHING CU AND CU/TI METAL LAYER OF LIQUID CRYSTAL DISPLAY DEVICE AND METHOD OF FABRICATING THE SAME

(75) Inventors: Gyoo-Chul Jo, Gyeonggi-do (KR); Gee-Sung Chae, Incheon (KR); Yong-Sup Hwang, Gyeonggi-do (KR); Oh-Nam Kwon, Chungcheonnam-do (KR); Kyoung-Mook Lee, Seoul (KR); Kui-Jong Baek, Chungcheongnam-do (KR); Tai-Hyung Rhee, Chungcheonnam-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 219 days.

(21) Appl. No.: 10/331,726

(22) Filed: Dec. 31, 2002

(65) Prior Publication Data

US 2003/0124851 A1 Jul. 3, 2003

(30) Foreign Application Priority Data

Dec. 31, 2001 (KR) .............................. 10-2001-0089324

(51) Int. Cl.$^7$ .......................... H01L 21/00; H01L 21/302
(52) U.S. Cl. .................... 438/745; 436/689; 436/149; 436/800
(58) Field of Search ....................... 438/745, 689, 438/149, 800

(56) References Cited

U.S. PATENT DOCUMENTS

2002/0076930 A1 * 6/2002 Jo et al. ..................... 438/689

* cited by examiner

Primary Examiner—Craig A. Thompson
(74) Attorney, Agent, or Firm—Morgan Lewis & Bockius LLP (57) ABSTRACT

An etching solution for etching one of a copper single metal layer and a copper (Cu)/titanium (Ti) double metal layer that serves as one of a gate electrode, a source electrode, and a drain electrode of a thin film transistor for a liquid crystal display (LCD) device includes oxone, fluoric compounds, one of a reducing agent and a weak oxidizing agent, an etching rate restrainer, $KHF_2$, and water.

20 Claims, 10 Drawing Sheets

ETCHING SOLUTION FOR ETCHING CU AND CU/TI METAL LAYER OF LIQUID CRYSTAL DISPLAY DEVICE AND METHOD OF FABRICATING THE SAME

This present invention claims the benefit of Korean Patent Application No. 2001-89324, filed in Korea on Dec. 31, 2001, which is hereby incorporated by reference.

BACKGROUND OF THE INVENTION

1. Field of the Invention

The present invention relates to an etching solution and more particularly, to an etching solution for a copper (Cu) single metal layer or copper (Cu)/titanium (Ti) double metal layer.

2. Discussion of the Related Art

Figure 1:
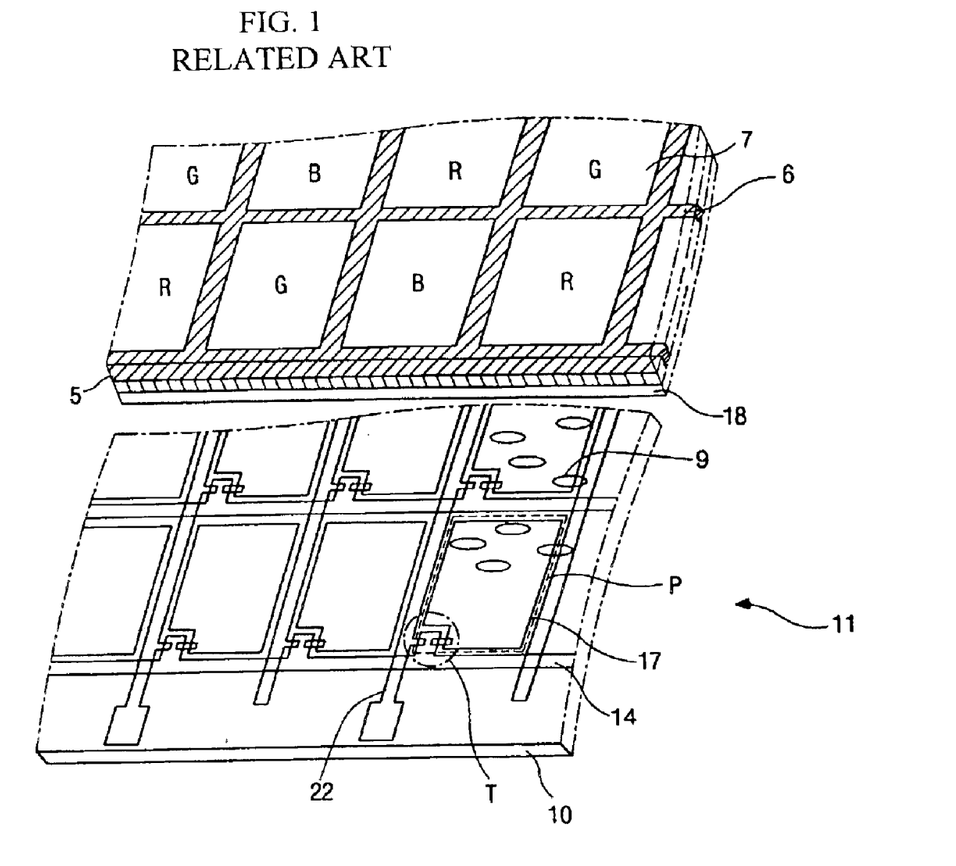
FIG. 1 is a perspective view of a liquid crystal display (LCD) device according to the related art.

FIG. 1 is a perspective view of a liquid crystal display (LCD) device according to the related art. In FIG. 1, a liquid crystal display (LCD) device has upper and lower substrate 5 and 10, and a liquid crystal material layer 9 interposed between the upper and lower substrate 5 and 10. The upper substrate 5 has color filters 7, black matrices 6 between each color filters 7, and a common electrode 18 that is formed on the color filters 7 and the black matrices 6. The lower substrate 10 has a pixel region "P," a pixel electrode 17 formed within the pixel region "P," a plurality of switching elements "T" and array lines. The lower substrate 10 is commonly referred to as an array substrate and a plurality of the switching elements "T" are formed at cross points of gate and data lines 14 and 22. The switching elements include thin film transistors "T" arranged in a matrix form. The pixel region "P" is defined by the gate and data lines 14 and 22 that cross each other and the transparent pixel electrode 17 is formed within the pixel region "P". The pixel and common electrodes 17 and 18 are formed of transparent conductive material, such as indium tin oxide (ITO), that is relatively superior in transmission of light. A liquid crystal display (LCD) device commonly uses optical anisotropy and polarization properties of liquid crystal molecules. The thin film transistor "T" has a gate electrode, a source electrode, a drain electrode, and a semiconductor layer. The gate electrode needs to be formed of material that has a low electric resistance and may include one of a copper (Cu) single layer and a copper (Cu)/titanium (Ti) double metal layer.

Figure 2A:
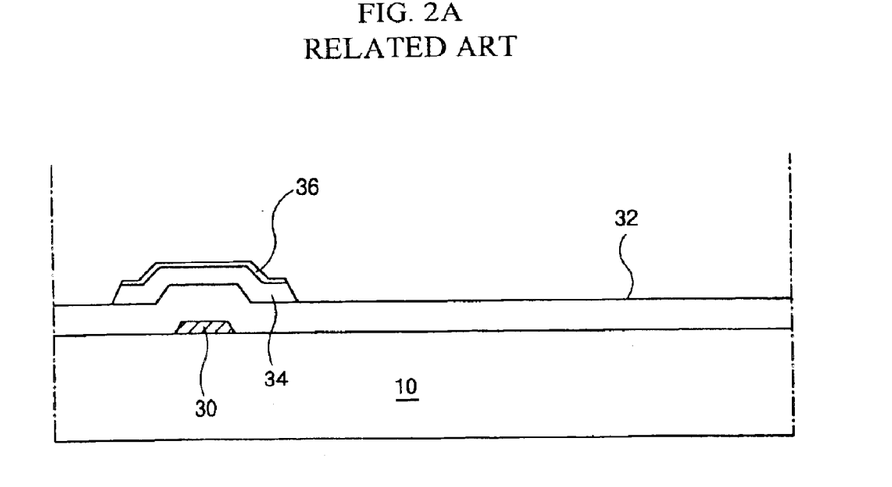
FIGS. 2A to 2D are cross sectional views of a fabricating sequence of an array substrate of a liquid crystal display (LCD) device according to the related art.

FIGS. 2A to 2D are cross sectional views of a fabricating sequence of an array substrate of a liquid crystal display (LCD) device according to the related art. In FIG. 2A, a gate line 14 (in FIG. 1) and a gate electrode 30 are formed by depositing a copper (Cu)/titanium (Ti) double metal layer on a transparent glass substrate 10, and then patterning the double metal layer. A gate insulating layer 32 is formed on the gate electrode 30 by depositing one of inorganic insulating materials, such as silicon nitride (SiNx) and silicon oxide (SiO$_2$), on the substrate 10. An active layer 34 and an ohmic contact layer 36, which are laminated over the gate electrode 30, are formed on the gate insulating layer 32. The active layer 34 is formed of pure amorphous silicon, and the ohmic contact layer 36 is formed of impurity-doped amorphous silicon.

Figure 2B:
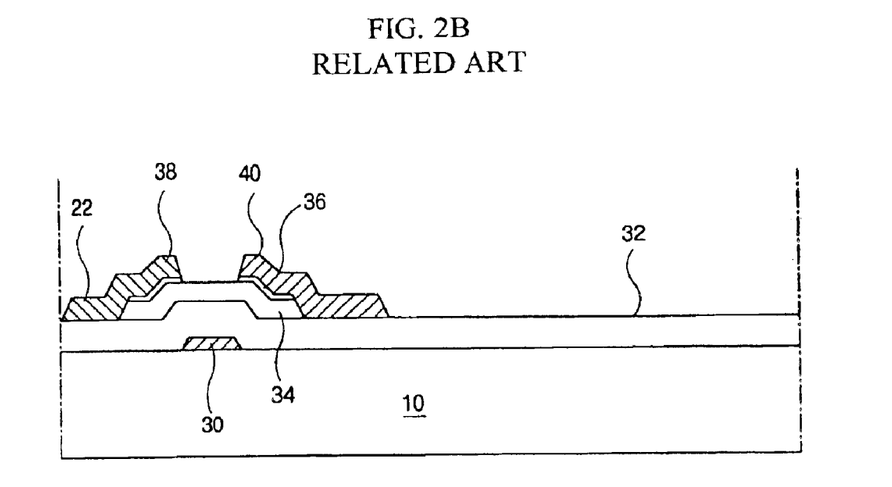

In FIG. 2B, source and drain electrodes 38 and 40 and a data line 22 are formed by depositing the copper (Cu)/titanium (Ti) double metal layer on the substrate 10, and then patterning the double metal layer. The source electrode 38 contacts the ohmic contact layer 36, and the drain electrode 40 is spaced apart from the source electrode 38. The data line 22 is connected to the source electrode 38.

Figure 2C:
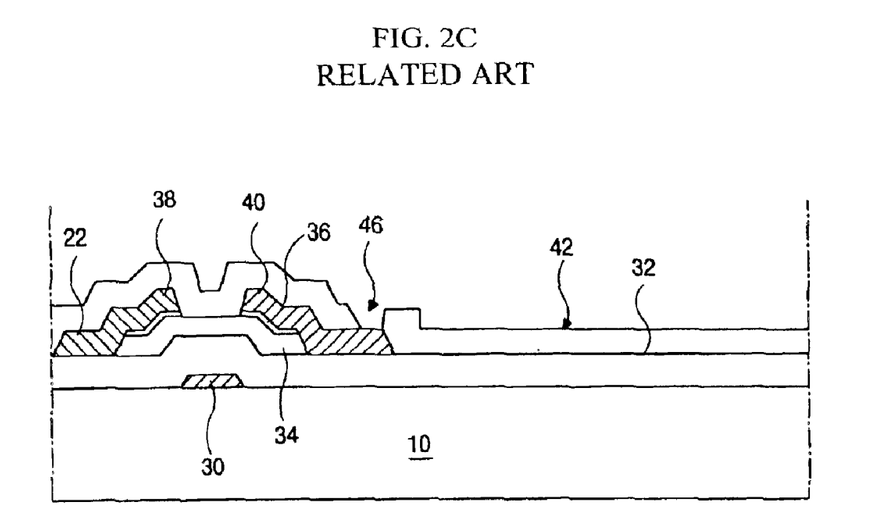

In FIG. 2C, a passivation layer 42 is formed by coating one of inorganic insulating materials, such as silicon nitride (SiNx) and silicon oxide (SiO$_2$), or transparent organic insulating materials, such as benzocyclobutene (BCB) and acrylic resins, on the gate insulating layer 32 over the substrate 10. A drain contact hole 46, which exposes a portion of the drain electrode 40, is formed through the passivation layer 42 by patterning the passivation layer 42.

Figure 2D:
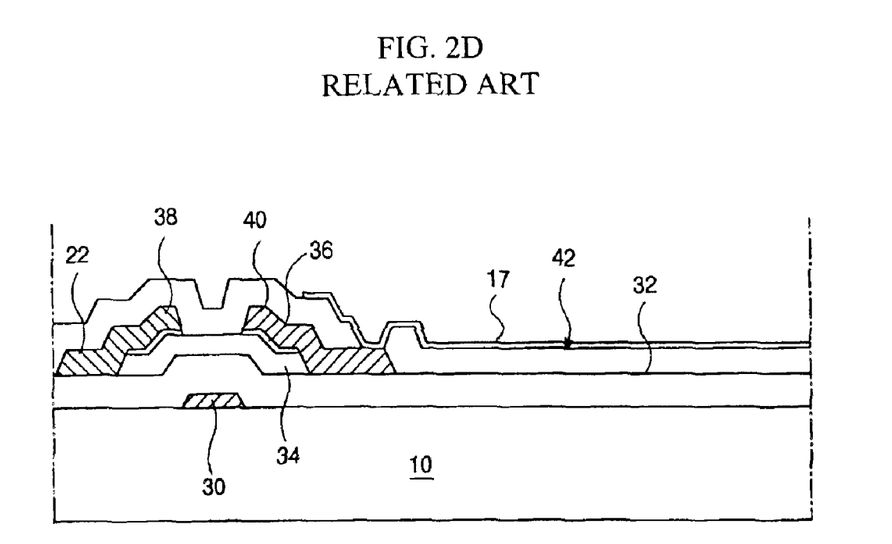

In FIG. 2D, the transparent pixel electrode 17, which contacts the drain electrode 40 through the drain contact hole 46, is formed on the passivation layer 42.

A copper (Cu) single metal layer or a copper (Cu)/titanium (Ti) double metal layer for forming the gate electrode 30 and the source and drain electrodes 38 and 40 is patterned by a wet etching method using an etching solution. Oxone (2KHSO$_5$.KHSO$_4$.K$_2$SO$_4$) is commonly used as the etching solution for the copper (Cu) single metal layer and a mixture of the oxone, hydrofluoric acid (HF), and ammonium fluoride (NH$_4$F) is commonly used as the etching solution for the copper (Cu)/titanium (Ti) double metal layer.

A copper (Cu) etching mechanism by the oxone is as follows:

$$KHSO_5 \rightarrow K^+ + HSO_5^- \tag{1}$$

$$HSO_5^- \rightarrow H^+ + SO_5^{2-} \tag{2}$$

$$Cu + SO_5^- \rightarrow CuO + KHSO_4 \tag{3}$$

$$Cu + KHSO_5 \rightarrow CuO + KHSO_4 \tag{4}$$

$$CuO + 2KHSO_4 \rightarrow CuSO_4 + K_2SO_4 + H_2O \tag{5}$$

However, in case of KHSO$_4$, it undergoes reactions as follows:

$$KHSO_4 \rightarrow K^+ + HSO_4^- \tag{6}$$

$$HSO_4^- + H_2O \rightarrow HSO_5^- + 2H^+ + 2e^- \tag{7}$$

The HSO$_5^-$ ion is resolved as in equation (8) when a hydrogen ion concentration (pH) is high or transition ions serving as a catalyst exists, and thus etching rate is accelerated.

$$HSO_5^- \rightarrow H^+ + SO_5^{2-} \tag{8}$$

The etching rate is accelerated until a concentration of KHSO$_4$ is reduced, and then the etching rate starts to be decelerated when the concentration of KHSO$_4$ passes the peak. In the previously stated reaction formulas, a reactant that is actually used for the reaction among the mixture of the oxone is KHSO$_5$. KHSO$_5$ is very unstable when it solely exists and thus is easy to be dissolved. Accordingly, it exists in a form of a mixture as in the mixture of oxone (2KHSO$_5$.KHSO$_4$.K$_2$SO$_4$). The K$_2$SO$_4$ is produced as a product after the reaction as in the equation (5). An initial etching rate using the oxone as an etching solution is increased as a catalytic reaction is activated by an increase of copper (Cu) ions. That is, the copper (Cu) ions that are produced in the following reaction (9) and (10) facilitate an etching of the copper (Cu) metal layer.

$$Cu^{+2} + 2e \rightarrow 2Cu^{+2} + 2e \tag{9}$$

$$Cu \rightarrow 2Cu^{+2} + 2e \tag{10}$$

Figure 3:
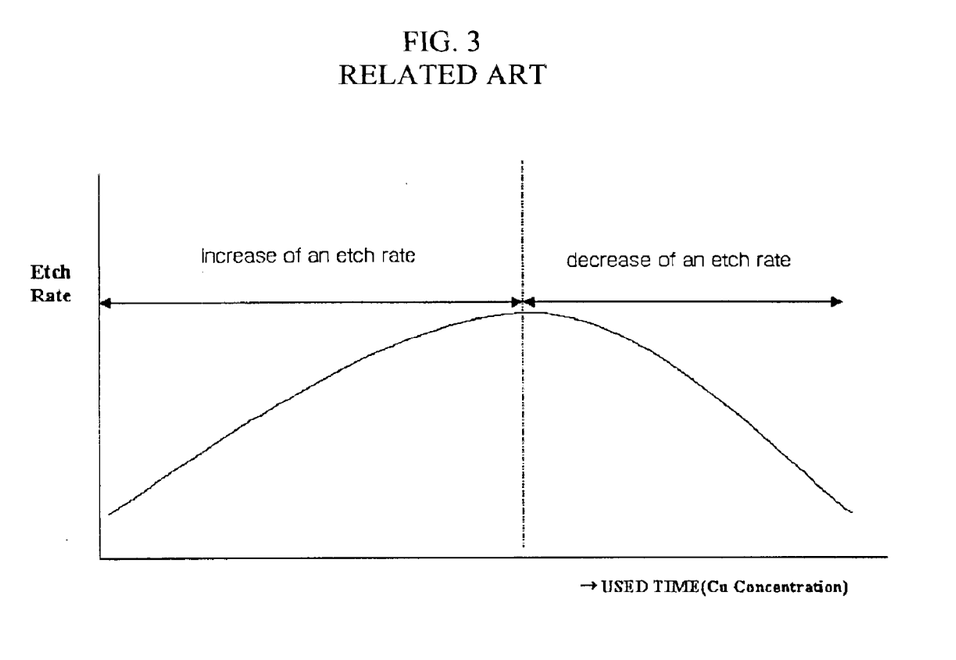
FIG. 3 is a graph illustrating a change of an etching rate as a copper concentration of etching solution increases according to an increase of a number of times the etching solution is used according to the related art.

Accordingly, the copper (Cu) metal layer is etched as in the following reaction:

FIG. 3 is a graph illustrating a change of an etching rate as a copper concentration of etching solution increases according to an increase of a number of times the etching solution is used according to the related art. In FIG. 3, the etching rate is increased as a concentration of the copper (Cu) is increased, and the etching rate is decreased as a concentration of the $KHSO_4$ is lowered due to consumption. That is, during an increasing section of the etching rate, the etching rate is increased as the copper (Cu) ions are increased and subsequently activating a catalytic reaction which increases a concentration of $SO_5^{2-}$. During a decreasing section of the etching rate, the etching rate is decreased as $KHSO_5.KHSO_4$ is consumed. Because the etching rate in not uniform due to a changing amount of the copper (Cu) ion, it is difficult for a side of a patterned copper (Cu) metal layer to obtain a taper angle. In addition, when the mixture of the oxone and hydrofluoric acid (HF) (or ammonium fluoride ($NH_4 F$)) is used as an etching solution for etching the copper (Cu)/titanium (Ti) double metal layer, it is possible for both sides of the patterned metal layer to obtain a taper angle. However, the taper angle is reduced owing to a difference between the etching rate of the copper (Cu) by the oxone and the etching rate of the titanium (Ti) by hydrofluoric acid (HF) and ammonium fluoride ($NH_4 F$) and owing to a lateral etching by the oxone, and thus a critical dimension loss (CD loss) is caused.

Figure 4:
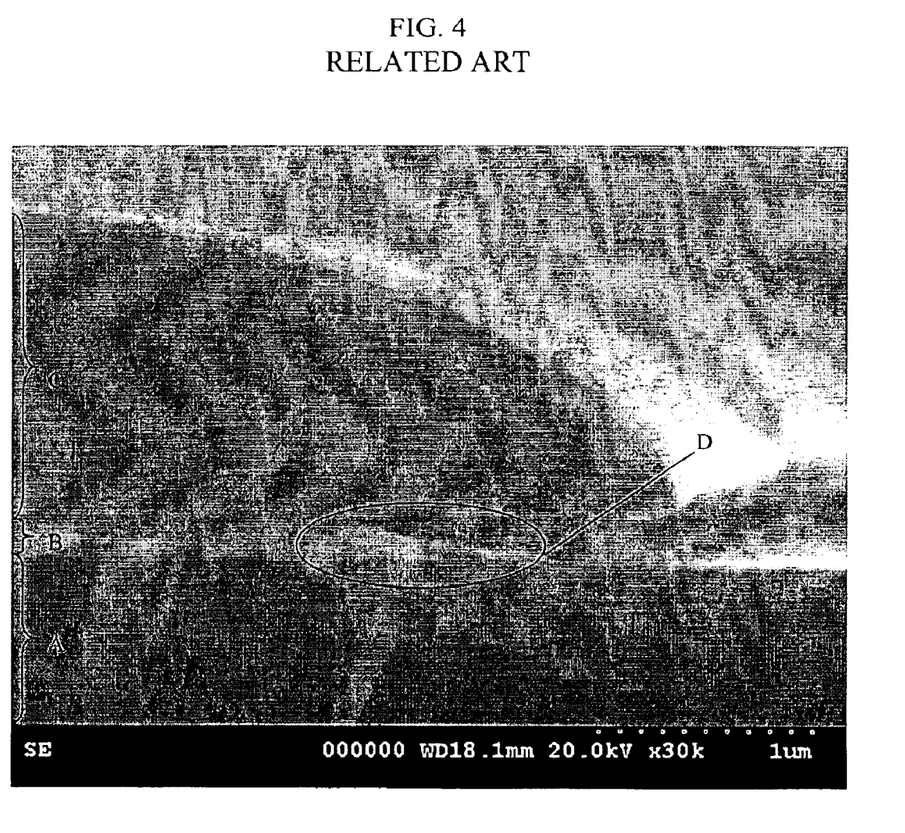
FIG. 4 is an electron microscopic photomicrograph of a cross-section of a photoresist and a copper (Cu)/titanium (Ti) double metal layer after a wet-etching process according to the related art.

FIG. 4 is an electron microscopic photomicrograph of a cross-section of a photoresist and a copper (Cu)/titanium (Ti) double metal layer after a wet-etching process according to the related art. In FIG. 4, region "A" is a glass substrate, region "B" is a patterned copper (Cu)/titanium (Ti) double metal layer on the glass substrate, and region "C" is a photoresist on the copper (Cu)/titanium (Ti) double metal layer. A side "D" of the copper (Cu)/titanium (Ti) double metal layer is over etched when the etching solution is used for etching the copper (Cu)/titanium (Ti) double metal layer. Moreover, hydrofluoric acid (HF) and ammonium fluoride ($NH_4 F$) that are used for etching the titanium (Ti) metal layer generate damage on a surface of the glass substrate when an amount of the hydrofluoric acid (HF) and ammonium fluoride ($NH_4 F$) is excessive in the etching solution.

Figure 5:
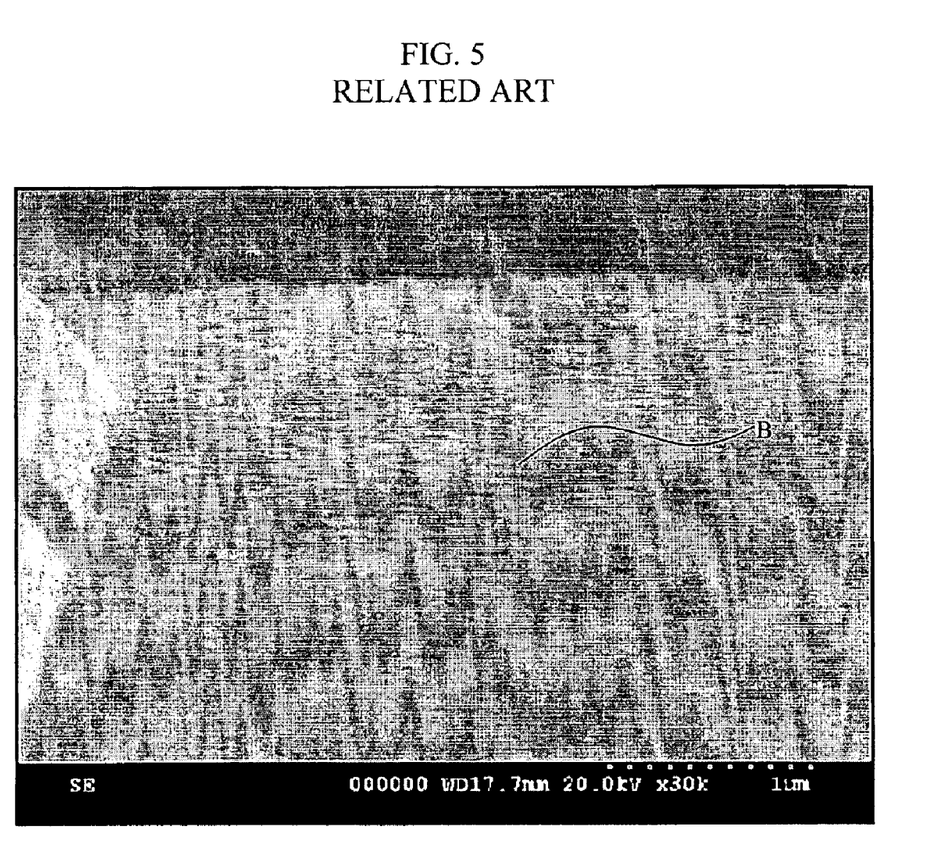
FIG. 5 is an electron microscopic photomicrograph illustrating damage on a surface of a glass substrate after a wet etching process in which hydrofluoric acid (HF) is over used according to the related art.

FIG. 5 is an electron microscopic photomicrograph illustrating damage on a surface of a glass substrate after a wet etching process in which hydrofluoric acid (HF) is over used according to the related art. In FIG. 5, if the hydrofluoric acid (HF) or the ammonium fluoride ($NH_4 F$) in the mixture of the oxone and the hydrofluoric acid (HF) (or ammonium fluoride ($NH_4 F$)) is over used, the surface "B" of the glass substrate is seriously damaged. If there occurs damage on the surface of the glass substrate occurs, the critical dimension loss (CD loss) may occur between the glass substrate and a layer structure that will be formed during a later process. To prevent these problems, the amount of the hydrofluoric acid (HF) or the ammonium fluoride ($NH_4 F$) may be reduced. However, if the amount of the hydrofluoric acid (HF) or the ammonium fluoride ($NH_4 F$) is reduced, the titanium (Ti) metal layer will not be completely removed, and a residue of the titanium (Ti) metal layer will remain.

SUMMARY OF THE INVENTION

Accordingly, the present invention is directed to an etching solution that substantially obviates one or more of problems due to limitations and disadvantages of the related art.

An object of the present invention is to provide an etching solution for etching a copper (Cu) single metal layer or a copper (Cu)/titanium (Ti) double metal layer into which an oxidizing agent, a reducing agent and salicylic acid derivative are added so that a side of the metal layer is patterned to have a proper taper angle and a total etching rate is improved.

Another object of the present invention is to provide a method of fabricating a liquid crystal display device by etching a copper (Cu) single metal layer or a copper (Cu)/titanium (Ti) double metal layer into which an oxidizing agent, a reducing agent and salicylic acid derivative are added so that a side of the metal layer is patterned to have a proper taper angle and a total etching rate is improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an etching solution for etching one of a copper single metal layer and a copper (Cu)/titanium (Ti) double metal layer that serves as one of a gate electrode, a source electrode, and a drain electrode of a thin film transistor for a liquid crystal display (LCD) device includes oxone, fluoric compounds, one of a reducing agent and a weak oxidizing agent, an etching rate restrainer, $KHF_2$, and water.

In another aspect, a method for fabricating a thin film transistor for a liquid crystal display device includes forming gate, source, and drain electrodes of one of a copper single metal layer and a copper/titanium double metal layer on a substrate, and etching the one of a copper single metal layer and a copper/titanium double metal layer using an etching solution including oxone, fluoric compounds, one of a reducing agent and a weak oxidizing agent, an etching rate restrainer, $KHF_2$, and water.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiment of the present invention, which is illustrated in the accompanying drawings.

In the present invention, an etching solution into which a weak oxidizing agent, a reducing agent, and salicylic acid derivative are added to etch a copper (Cu) single metal layer or a copper (Cu)/titanium (Ti) double metal layer to have a proper taper angle at its side, thereby improving a total etching rate. An addition of the oxidizing agent and the reducing agent to the etching solution, i.e., a mixture of oxone, hydrofluoric acid (HF), ammonium fluoride ($NH_4 F$), and water, lowers a dissolving ability of the oxone and thus prevents a rapid change of the etching rate according to a concentration of a copper (Cu) ion. The reducing agent may be selected from $Na_2SO_3$, $K_2SO_3$ and $(NH_4)_2SO_3$ and the oxidizing agent is $(NH_4)_2S_2O_8$. The reducing agent serves to repress a self dissolution of $KHSO_5$ in the oxone and the weak oxidizing agent serves to reduce the $KHSO_5$, which is a strong oxidizing agent. Accordingly, the reducing agent or the weak oxidizing agent can reduce the etching rate of the copper (Cu) metal layer by controlling an amount of the $KHSO_5$.

Figure 6:
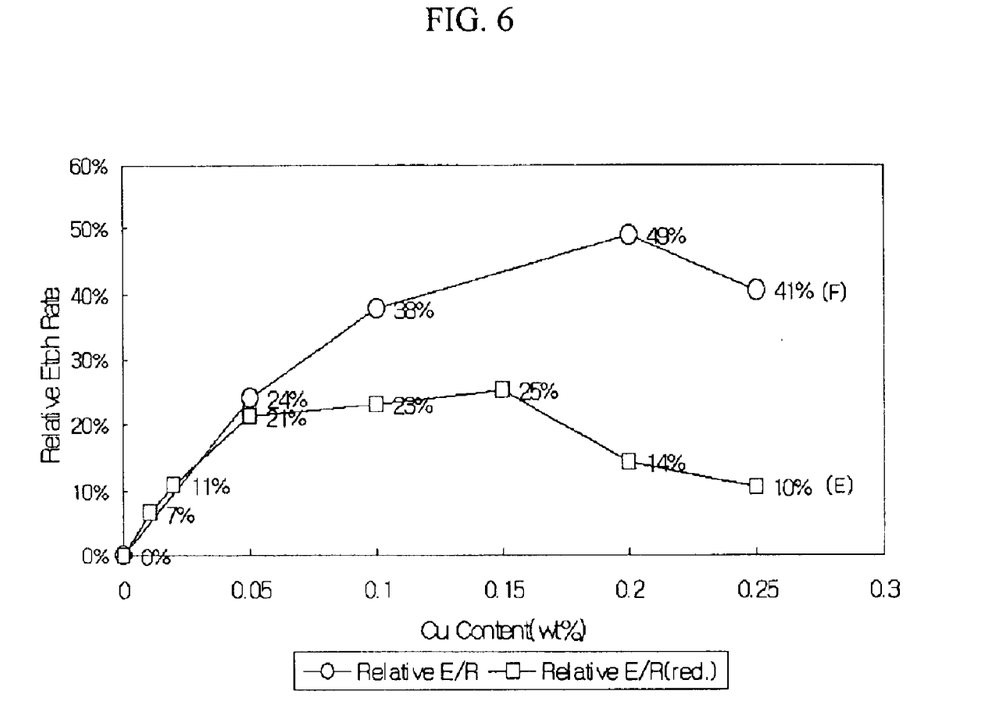
FIG. 6 is a graph illustrating a change of an etching rate of an etching solution according to a change of a copper ion concentration and a change of etching rate of the etching solution when a reducing agent is added to the etching solution according to the present invention.

FIG. 6 is a graph illustrating a change of an etching rate of an etching solution according to a change of a copper ion concentration and a change of etching rate of the etching solution when a reducing agent is added to the etching solution according to the present invention. In FIG. 6, a relative etching rate "E" of the copper (Cu) metal layer may be slowed when the reducing agent is added to the etching solution, and a relative etching rate "F" increases when the reducing agent is not added to the etching solution. Accordingly, if the reducing agent is added to the etching solution, a change of the relative etching rate according to an increase of a copper ion concentration can be controlled between 25% and 50% of an initial etching rate. On the other hand, if a etching rate restrainer is added to the etching solution for the copper (Cu)/titanium (Ti) double metal layer, i.e., the mixture of oxone, hydrofluoric acid (HF), ammonium fluoride ($NH_4 F$), and water, to slow etching time, it may be possible for both sides of the double metal layer to have a taper angle between 40° (degree) and 60° (degree). Salicylic acid derivative may be used for the etching rate restrainer, thereby preventing lateral etching of the copper (Cu) metal layer occurred by the oxone.

Figure 7:
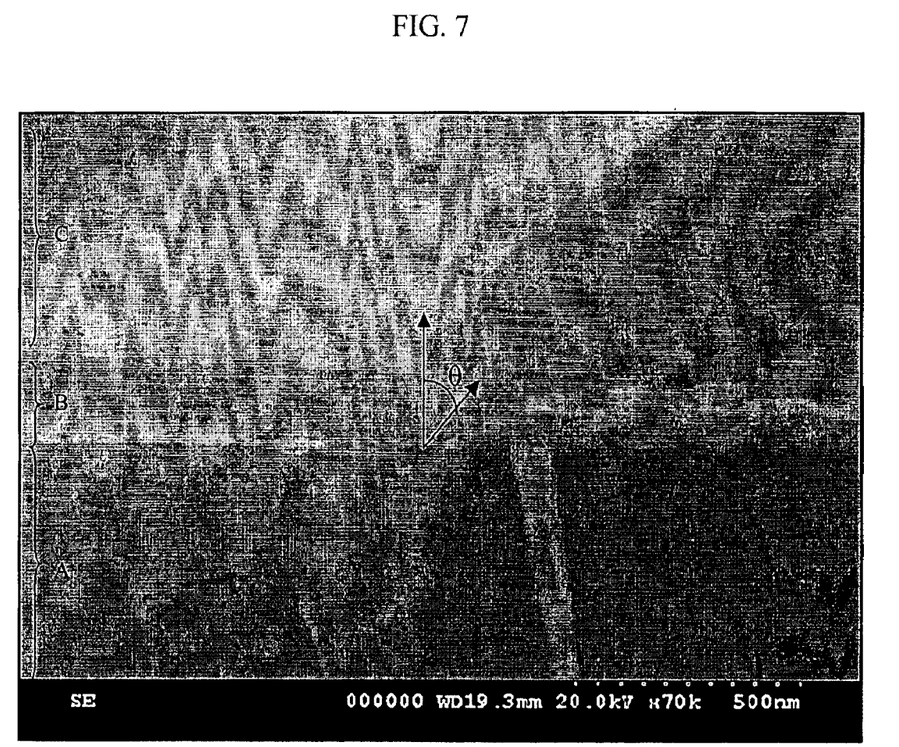
FIG. 7 is an electron microscopic photomicrograph illustrating cross-sections of a photoresist and a copper (Cu)/titanium (Ti) double metal layer after a wet-etching process in which an etching rate restrainer of the copper (Cu) metal layer is added to an etching solution according to the present invention.

FIG. 7 is an electron microscopic photomicrograph illustrating cross-sections of a photoresist and a copper (Cu)/titanium (Ti) double metal layer after a wet-etching process in which an etching rate restrainer of the copper (Cu) metal layer is added to an etching solution according to the present invention. In FIG. 7, the copper (Cu)/titanium (Ti) double metal layer "B" may be formed on a glass substrate "A," and a photoresist "C" may be formed on the copper (Cu)/titanium (Ti) double metal layer "B," Accordingly, if the copper (Cu)/titanium (Ti) double metal layer "B" is etched with the etching solution, i.e., the mixture of oxone, hydrofluoric acid (HF), ammonium fluoride ($NH_4 F$), and water, into which the salicylic acid derivative is added using the photoresist "C" as an etch stopper, the double metal layer may be etched to have a proper taper angle θ (degree). In addition, it may be possible that damage on the surface of the glass substrate is minimized and an etching rate of the titanium (Ti) is simultaneously accelerated without an increase of the hydrofluoric acid (HF) and ammonium fluoride ($NH_4 F$) by adding a fluoric compound other than the hydrofluoric acid (HF) and ammonium fluoride ($NH_4 F$) that is added to the oxone to etch the titanium (Ti) metal layer. The added additional fluoric compound is $KHF_2$ and it is experimentally observed that residues of the titanium (Ti) metal layer can be removed and the etching rate can be increased without damage to the surface of the glass substrate by increasing an amount of the $KHF_2$.

Figure 8:
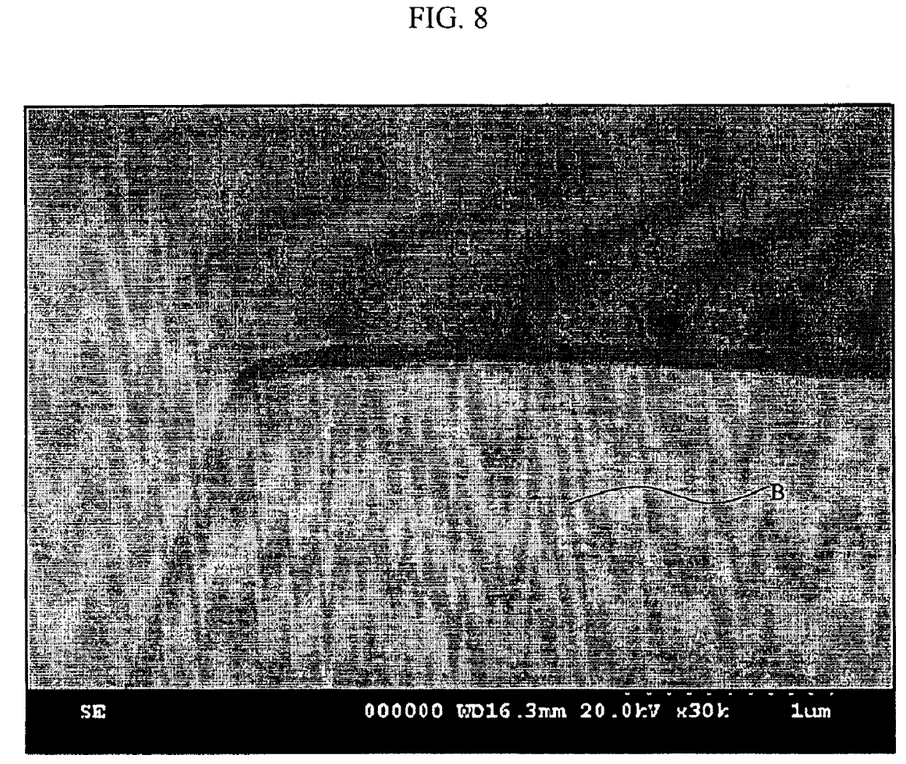
FIG. 8 is an electron microscopic photomicrograph illustrating a surface of a glass substrate on which residues of titanium (Ti) metal layer are removed and damage is minimized after a wet etching process in which $KHF_2$ is added to an etching solution according to the present invention.

FIG. 8 is an electron microscopic photomicrograph illustrating a surface of a glass substrate on which residues of titanium (Ti) metal layer are removed and damage is minimized after a wet etching process in which $KHF_2$ is added to an etching solution according to the present invention. In FIG. 8, the damage on the surface "B" of the glass substrate is minimized and residues of the titanium (Ti) metal layer are not observed as compared to that of FIG. 5. The etching solution is a mixture of oxone, hydrofluoric acid (HF), ammonium fluoride ($NH_4 F$), water, the reducing agent or the oxidizing agent, salicylic acid derivative, and $KHF_2$ in which a concentration of the oxone is between 3 wt % and 5 wt %, the hydrofluoric acid (HF) between 0.1 wt % and 0.3 wt %, the ammonium fluoride ($NH_4 F$) between 0 wt % and 0.1 wt5, the reducing agent or the oxidizing agent between 0.1 wt % and 1 wt %, salicylic acid derivative between 0.01 wt % and 0.2 wt % and the $KHF_2$ between 0.1 wt % and 0.5 wt %. The surface of the glass substrate, as shown in FIG. 8, may be obtained by carrying out the wet etching process with the etching solution under a normal temperature condition (25±2° C.).

Figure 9:
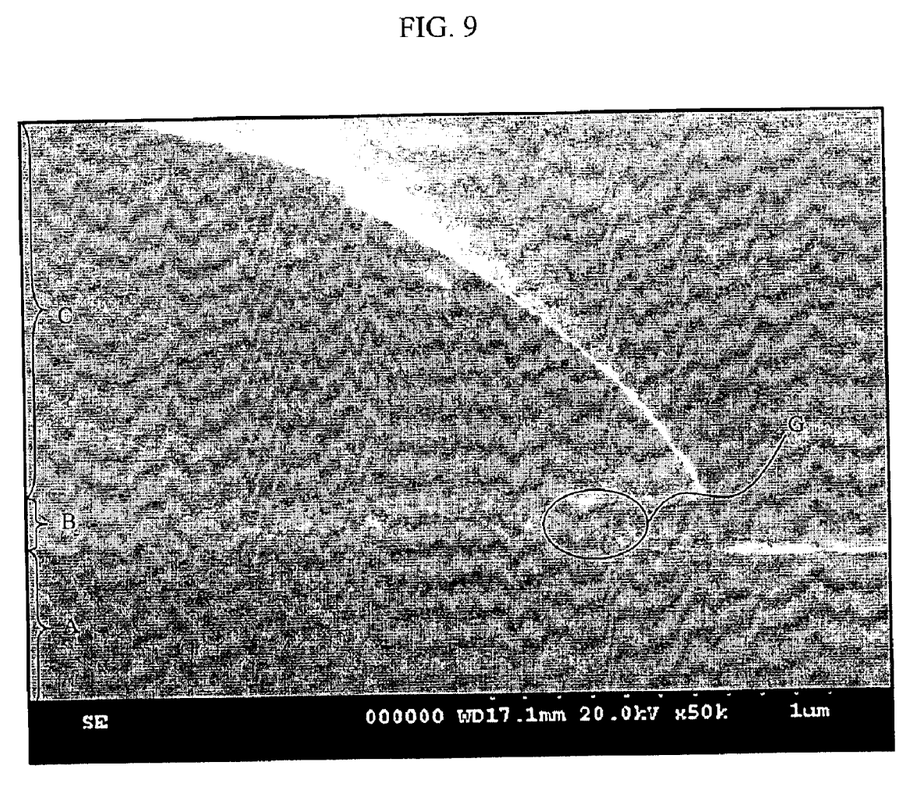
FIG. 9 is an electron microscopic photomicrograph illustrating cross-sections of a photoresist and a copper (Cu)/titanium (Ti) double metal layer after a wet-etching process in which an etching solution is used according to the present invention.

FIG. 9 is an electron microscopic photomicrograph illustrating cross-sections of a photoresist and a copper (Cu)/titanium (Ti) double metal layer after a wet-etching process in which an etching solution is used according to the present invention. In FIG. 9, the copper (Cu)/titanium (Ti) double metal layer "B" is observed on the glass substrate "A," and the photoresist "C" is observed on the copper (Cu)/titanium (Ti) double metal layer "B". A region "G" is a side of the copper (Cu)/titanium (Ti) double metal layer etched to have a taper angle between 40° (degree) and 60° (degree).

Accordingly, to etch the copper (Cu) single metal layer or the copper/titanium (Ti) double metal layer for forming a gate electrode and source and drain electrodes of a thin film transistor of a liquid crystal display (LCD) device, a proper taper etching and uniform patterning may be carried out. Accordingly, if the double metal layer is etched to have a proper taper angle, an inferiority of a contact between the glass substrate and a layer structure that will be formed in a later process can be avoided.

It will be apparent to those skilled in the art that various modifications and variations can be made in the etching solution for etching cu or cu/ti metal layer of liquid crystal display device of the present invention without departing from the spirit or scope of the invention. Thus, it is intended that the present invention cover the modifications and variations of this invention provided they come within the scope of the appended claims and their equivalents.

What is claimed is:

1. An etching solution for etching one of a copper single metal layer and a copper (Cu)/titanium (Ti) double metal layer that serves as one of a gate electrode, a source electrode, and a drain electrode of a thin film transistor for a liquid crystal display (LCD) device, comprising:
   oxone;
   fluoric compounds;
   one of a reducing agent and a weak oxidizing agent;
   an etching rate restrainer;
   $KHF_2$; and
   water.

2. The etching solution according to claim 1, wherein a concentration of the oxone is between 3 and 5 wt %.

3. The etching solution according to claim 1, wherein the fluoric compounds include hydrofluoric acid (HF) and ammonium fluoride ($NH_4 F$).

4. The etching solution according to claim 3, wherein a concentration of the hydrofluoric acid (HF) is between 0.1 and 0.3 wt % and a concentration of the ammonium fluoride ($NH_4 F$) is between 0 and 0.1 wt %.

5. The etching solution according to claim 1, wherein the weak oxidizing agent includes $(NH_4)_2S_2O_8$.

6. The etching solution according to claim 5, wherein a concentration of the weak oxidizing agent is between 0.1 and 1 wt %.

7. The etching solution according to claim 1, wherein the reducing agent includes one of $Na_2SO_3$, $K_2SO_3$ and $(NH_4)SO_3$.

8. The etching solution according to claim 7, wherein a concentration of the reducing agent is between 0.1 and 1 wt %.

9. The etching solution according to claim 1, wherein the etching rate restrainer includes a salicylic acid derivative.

10. The etching solution according to claim 9, wherein a concentration of the salicylic acid derivative is between 0.01 and 0.2 wt %.

11. A method for fabricating a thin film transistor for a liquid crystal display device, comprising steps of:
   forming gate, source, and drain electrodes of one of a copper single metal layer and a copper/titanium double metal layer on a substrate; and
   etching the one of a copper single metal layer and a copper/titanium double metal layer using an etching solution including oxone, fluoric compounds, one of a reducing agent and a weak oxidizing agent, an etching rate restrainer, $KHF_2$, and water.

12. The method according to claim 11, wherein a concentration of the oxone is between 3 and 5 wt %.

13. The method according to claim 11, wherein the fluoric compounds include hydrofluoric acid (HF) and ammonium fluoride ($NH_4 F$).

14. The method according to claim 13, wherein a concentration of the hydrofluoric acid (HF) is between 0.1 and 0.3 wt % and a concentration of the ammonium fluoride ($NH_4 F$) is between 0 and 0.1 wt %.

15. The method according to claim 11, wherein the weak oxidizing agent includes $(NH_4)_2S_2O_8$.

16. The method according to claim 15, wherein a concentration of the weak oxidizing agent is between 0.1 and 1 wt %.

17. The method according to claim 11, wherein the reducing agent includes one of $Na_2SO_3$, $K_2SO_3$ and $(NH_4)SO_3$.

18. The method according to claim 17, wherein a concentration of the reducing agent is between 0.1 and 1 wt %.

19. The method according to claim 1, wherein the etching rate restrainer includes a salicylic acid derivative.

20. The method according to claim 19, wherein a concentration of the salicylic acid derivative is between 0.01 and 0.2 wt %.

* * * * *